(12) United States Patent
Sung

(10) Patent No.: US 11,329,649 B2
(45) Date of Patent: May 10, 2022

(54) PORT CONTROLLER DEVICE

(71) Applicant: REALTEK SEMICONDUCTOR CORPORATION, Hsinchu (TW)

(72) Inventor: Ya-Hsuan Sung, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 17/315,391

(22) Filed: May 10, 2021

(65) Prior Publication Data

US 2021/0367599 A1 Nov. 25, 2021

(30) Foreign Application Priority Data

May 19, 2020 (TW) ................. 109116514

(51) Int. Cl.
*H03K 19/017* (2006.01)
*H03K 19/17736* (2020.01)
*H03K 19/094* (2006.01)
*H03K 19/17784* (2020.01)

(52) U.S. Cl.
CPC . *H03K 19/01742* (2013.01); *H03K 19/09421* (2013.01); *H03K 19/1774* (2013.01); *H03K 19/17784* (2013.01)

(58) Field of Classification Search
None
See application file for complete search history.

(56) References Cited

U.S. PATENT DOCUMENTS 10,860,517 B1 * 12/2020 Wang .............. H02M 3/06
2016/0092393 A1 * 3/2016 Nge ............. G06F 13/4282
710/14

* cited by examiner

*Primary Examiner* — Jany Richardson
(74) *Attorney, Agent, or Firm* — WPAT, PC

(57) ABSTRACT

A port controller device includes a pull-up resistor, a switching circuit, an enabling circuitry, and a protection circuitry. The pull-up resistor is configured to be coupled to a port, in which the port is configured to be coupled to a channel configuration pin of an electronic device. The switching circuit is configured to selectively transmit a supply voltage to the port via the pull-up resistor according to a first control signal, and turn off a signal path between the pull-up resistor and the port according to a second control signal. The enabling circuitry is configured to generate the first control signal according to an enable signal and the supply voltage. The protection circuitry is configured to generate the second control signal in response to a voltage from the port when the supply voltage is not powered, in order to limit a current from the port.

20 Claims, 6 Drawing Sheets

PORT CONTROLLER DEVICE

BACKGROUND

1. Technical Field

The present disclosure relates to a port controller device. More particularly, the present disclosure relates to a port controller device for controlling a channel configuration pin in a universal serial bus (USB) type-C interface.

2. Description of Related Art

A universal serial bus (USB) has been widely utilized in various electronic devices, in order to transfer data with other devices or transfer energy. In a USB t e-C interface, a channel configuration pin is able to provide different resistance values to a channel configuration pin of another device to generate a detect voltage, in order to set operation mode and a configuration of a channel between both parties. In a current interface control circuit, when the device is not powered, a leakage current from the channel configuration pin may cause the detect voltage to be inaccurate or may cause additional power consumption. On the other hand, with development of processes, a withstand voltage of a transistor is getting lower, and is not suitable for implementing the current interface control circuit.

SUMMARY

In some aspects of the present disclosure, a port controller device includes a pull-up resistor, a switching circuit, an enabling circuitry, and a protection circuitry. The pull-up resistor is configured to be coupled to a port, in which the port is configured to be coupled to a channel configuration pin of an electronic device. The switching circuit is configured to selectively transmit a supply voltage to the port via the pull-up resistor according to a first control signal, and turn off a signal path between the pull-up resistor and the port according to a second control signal. The enabling circuitry is configured to generate the first control signal according to an enable signal and the supply voltage. The protection circuitry is configured to generate the second control signal in response to a voltage from the port when the supply voltage is not powered, in order to limit a current from the port.

These and other objectives of the present disclosure will no doubt become obvious to those of ordinary skill in the art after reading the following detailed description that are illustrated in the various figures and drawings.

DETAILED DESCRIPTION

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to various embodiments given in this specification.

In this document, the term "coupled" may also be termed as "electrically coupled," and the term "connected" may be termed as "electrically connected." "Coupled" and "connected" may mean "directly coupled" and "directly connected" respectively, or "indirectly coupled" and "indirectly connected" respectively. "Coupled" and "connected" may also be used to indicate that two or more elements cooperate or interact with each other. In this document, the term "circuitry" may indicate a system formed with one or more circuits. The term "circuit" may indicate an object, which is formed with one or more transistors and/or one or more active/passive elements based on a specific arrangement, for processing signals.

As used herein, "around", "about" or "approximately" shall generally mean within 20 percent, preferably within 10 percent, and more preferably within 5 percent of a given value or range. Numerical quantities given herein are approximate, meaning that the term "around", "about" or "approximately" can be inferred if not expressly stated.

As used herein, the term "and/or" includes any and all combinations of one or more of the associated listed items. Although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments. For ease of understanding, like elements in various figures are designated with the same reference number.

Figure 1:
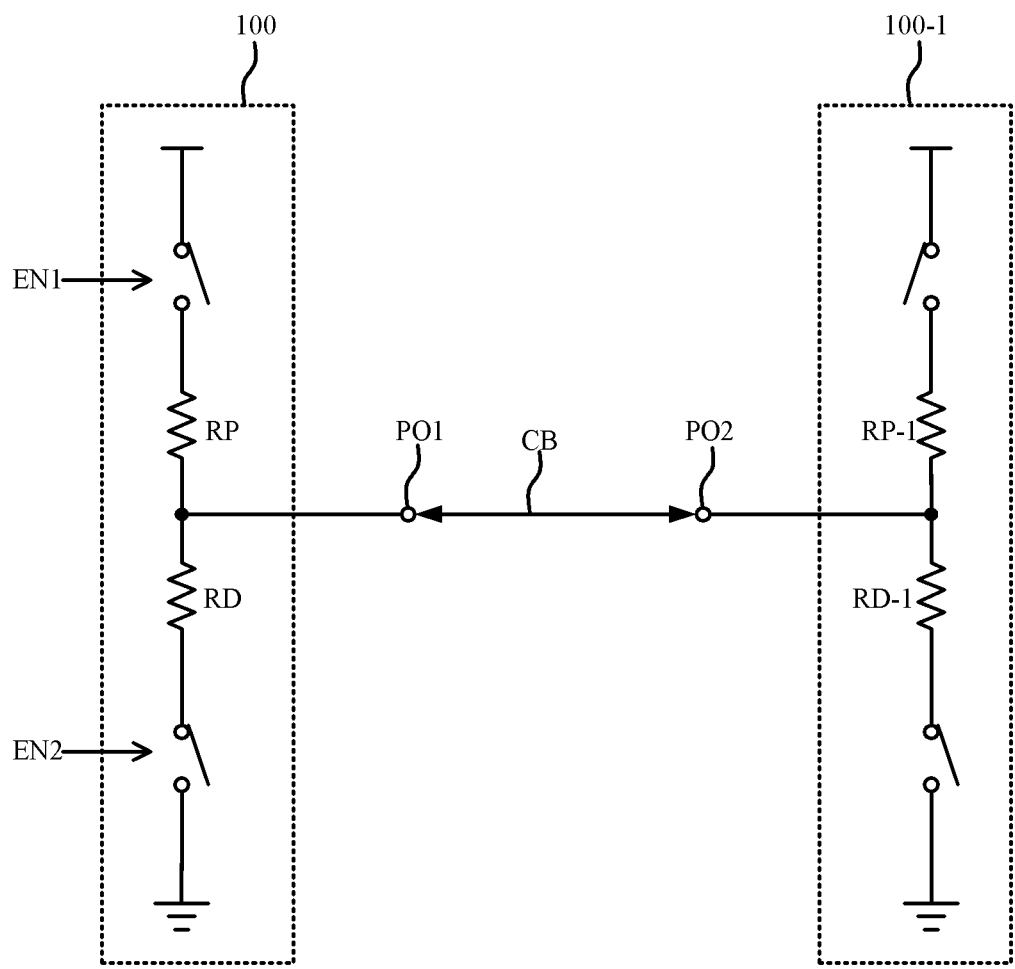
FIG. 1 is a schematic diagram of a port controller device being connected with an electronic device according to some embodiments of the present disclosure.

FIG. 1 is a schematic diagram of a port controller device 100 being connected with an electronic device 100-1 according to some embodiments of the present disclosure. In some embodiments, the port controller device 100 may be applied to various types of electronic devices (e.g., mobile phone, flash drive, wireless headphone, computer, etc.). In some embodiments, the port controller device 100 is configured to configure a channel of a port PO1 according to an enable signal EN1 and an enable signal EN2. The port PO1 may be connected to a port PO2 of an external electronic device 100-1 via a cable CB. For example, the port PO1 may be a configuration channel pin of a universal serial bus (USB) type-C interface, and the port PO2 may be a configuration channel pin of the external electronic device 100-1. According to the enable signal EN1 and the enable signal EN2, a resistor RP (or a resistor RD) provided from the port PO1 and a resistor RD-1 (or a resistor RP-1) of the electronic device 100-1 are able to perform a voltage division, in order to detect a connection orientation and/or a subsequent operating mode of the cable CB.

Figure 2:
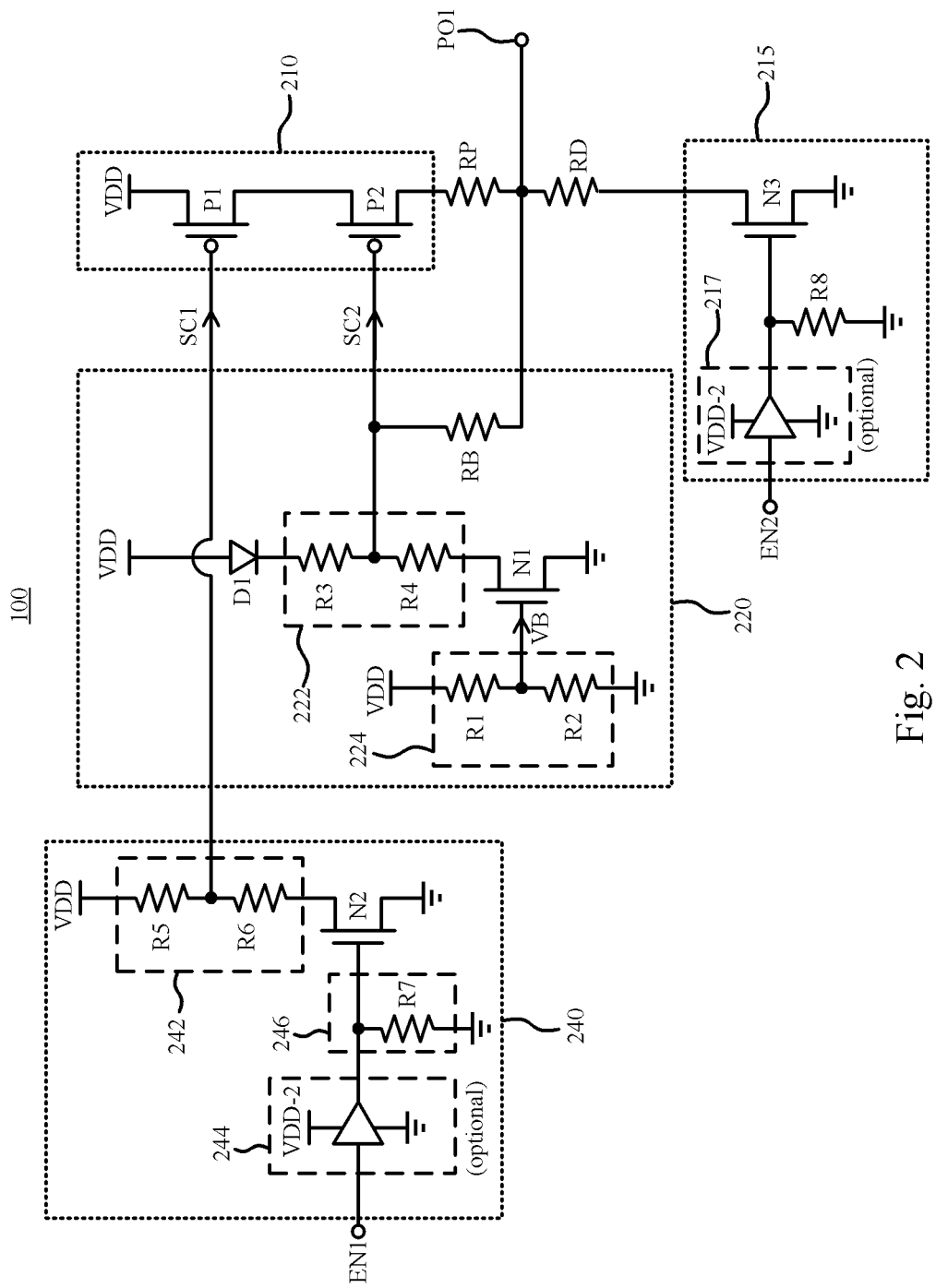
FIG. 2 is a circuit diagram of the port controller device in FIG. 1 according to some embodiments of the present disclosure.

FIG. 2 is a circuit diagram of the port controller device 100 in FIG. 1 according to some embodiments of the present disclosure. The port controller device 100 includes a pull-up resistor RP, a pull-down resistor RD, a switching circuit 210, a switching circuit 215, a protection circuitry 220, and an enabling circuitry 240.

The pull-up resistor RP and the pull-down resistor RD are coupled to the port PO1. The switching circuit 210 selectively transmits a supply voltage VDD to the port PO1 via the pull-up resistor RP according to a control signal SC1, and turns off a signal path (e.g., a signal path SP in FIG. 3A) between the pull-up resistor RP and the port PO1 according to a control signal SC2. The switching circuit 215 selectively couples the port PO1 to ground via the pull-down resistor RD according to the enable signal EN2. If the port PO1 receives the supply voltage VDD via the pull-up resistor RP or is coupled to ground via the pull-down resistor RD, the aforementioned voltage division can be performed.

The switching circuit 210 includes a transistor P1 and a transistor P2. A first terminal (e.g., drain/source) of the transistor P1 is configured to receive the supply voltage VDD, and a control terminal (e.g., gate) of the transistor P1 is coupled to the enabling circuitry 240 to receive the control signal SC1. The transistor P1 determines whether to transmit the supply voltage VDD to the port PO1 via the pull-up resistor RP according to the control signal SC1. A first terminal of the transistor P2 is coupled to a second terminal (e.g., source/drain) of the transistor P1, a second terminal of the transistor P2 is coupled to the pull-up resistor RP, and a control terminal of the transistor P2 is coupled to the protection circuitry 220 to receive the control signal SC2. As shown in FIG. 3C, the transistor P2 may turn off the signal path SP according to the control signal SC2.

The protection circuitry 220 is configured to generate the control signal SC2 in response to a voltage from the port PO1 when the supply voltage VDD is not powered, in order to limit a current from the port PO1. Operations regarding herein will be described with reference to FIG. 3C. In some embodiments, when the supply voltage VDD is powered, it indicates that a system power source that provides the supply voltage VDD is turned on properly, such that the supply voltage VDD has a predetermined level (which may be, but not limited to, 3.3 volts (V)). In some embodiments, when the supply voltage VDD is not powered, it indicates that the system power source that provides the supply voltage VDD is interrupted or is not turned on, such that the supply voltage VDD has a floating level or 0V.

The protection circuitry 220 includes a resistor RB, a diode D1, a voltage generator circuit 222, a transistor N1, and a voltage generator circuit 224. A first terminal of the resistor RB is coupled to the control terminal of the transistor P2, and a second terminal of the resistor RB is coupled to the port PO1 and the pull-up resistor RP. In some embodiments, a resistance value of the resistor RB is much greater than that of the pull-up resistor RP. For example, the resistance value of the resistor RB is at least ten times of the resistance value of the pull-up resistor RP. An anode of the diode D1 is configured to receive the supply voltage VDD. The voltage generator circuit 222 receives the supply voltage VDD from a cathode of the diode D1 and generates the control signal SC2 according to the supply voltage VDD.

In some embodiments, if a withstand voltage of the transistor P2 is lower than the supply voltage VDD, the voltage generator circuit 222 is further configured to divide the supply voltage VDD to generate the control signal SC2. For example, the transistor P2 may be implemented with a laterally diffused metal oxide semiconductor (LDMOS). In some embodiments, the withstand voltage (e.g., about 5V) of a drain of the transistor P2 (which is implemented with LDMOS) is higher, and a withstand voltage (e.g., about 1.8V) of a gate or a source of the transistor P2 is lower. In this example, the supply voltage VDD (e.g., about 3V) is higher than the withstand voltage of the gate (or the source) of the transistor P2. Accordingly, the voltage generator circuit 222 divides the supply voltage VDD to generate the control signal SC2, in order to prevent the transistor P2 from being damaged.

For example, the voltage generator circuit 222 includes a resistor R3 and a resistor R4. A first terminal of the resistor R3 is coupled to the cathode of the diode D1 to receive the supply voltage VDD, and a second terminal of the resistor R3 is coupled to the first terminal of the resistor RB. A first terminal of the resistor R4 is coupled to the second terminal of the resistor R3, and the second terminal of the resistor R4 is coupled to a first terminal of the transistor N1. The voltage generator circuit 222 is configured to provide the control signal SC2 when the supply voltage VDD is powered. The resistors R3 and R4 may have (but not limited to) the same resistance values. Under this condition, when the supply voltage VDD is powered, the resistors R3 and R4 may divide the supply voltage VDD to generate a half of the supply voltage VDD (e.g., 1.65V) to be the control signal SC2. As a result, the control signal SC2 can be withstood by the transistor P2.

A second terminal of the transistor N1 is coupled to ground, and a control terminal of the transistor N1 is coupled to the voltage generator circuit 224 to receive a bias signal VB. The transistor N1 is turned on according to the bias signal VB. The voltage generator circuit 224 generates the bias signal VB according to the supply voltage VDD. If the withstand voltage of the transistor N1 is lower than the supply voltage VDD (e.g., when the transistor N1 is implemented with LDMOS), the voltage generator circuit 224 divides the supply voltage VDD to generate the bias signal VB. As a result, the transistor N1 is prevented from being damaged.

The voltage generator circuit 224 includes a resistor R1 and a resistor R2. A first terminal of the resistor R1 receives the supply voltage VDD, and a second terminal of the resistor R1 is coupled to a first terminal of the resistor R2. A second terminal of the resistor R2 is coupled to ground. In some embodiments, the transistors R1 and R2 may have the same resistance value. As a result, when the supply voltage VDD is powered, the voltage generator circuit 224 may generate a half of the supply voltage VDD to be the bias signal VB, in order to turn on the transistor N1. Alternatively, if the supply voltage VDD is not powered, the voltage generator circuit 224 generates the bias signal VB having a level of ground voltage (e.g., 0V), in order to turn off the transistor N1.

The enabling circuitry 240 is configured to generate the control signal SC1 according to the enable signal EN1 and the supply voltage VDD. For example, the enabling circuitry 240 includes a voltage generator circuit 242, a transistor N2, a buffer circuit 244, and a resistive circuit 246. The voltage generator circuit 242 generates the control signal SC1 according to the supply voltage VDD. In some embodiments, if a withstand voltage of the transistor P1 is lower than the supply voltage VDD, the voltage generator circuit 242 is further configured to divide the supply voltage VDD to generate the control signal SC1. Similar to the above examples, if the transistor P1 is implemented with LDMOS, the voltage generator circuit 242 may divide the supply voltage VDD to generate the control signal SC1. As a result, the transistor P1 is prevented from being damaged.

The voltage generator circuit 242 includes a resistor R5 and a resistor R6. A first terminal of the resistor R5 receives the supply voltage VDD, and a second terminal of the resistor R5 is coupled to a first terminal of the resistor R6, in order to generate the control signal SC1. A first terminal of the transistor N2 is coupled to a second terminal of the resistor R6, a second terminal of the transistor N2 is coupled to ground, and a control terminal of the transistor N2 is coupled to the resistive circuit 246, and receives the enable signal EN1 via the buffer circuit 244. The transistor N2 is turned on according to the enable signal EN1.

The buffer circuit 244 is driven by a supply voltage VDD-2, and transmits the enable signal EN1 to a control terminal of the transistor N2. In some embodiments, the enable signal EN1 is from a digital circuit in the system, in which the digital circuit is driven by the supply voltage VDD-2, and the supply voltage VDD-2 is lower than the supply voltage VDD. In an example, the supply voltage VDD-2 may be (but not limited to) about 1.8V, and the supply voltage VDD may be (but not limited to) about 3V. In some embodiments, the enabling circuitry 240 does not employ the buffer circuit 244. In other words, in these embodiments, the enable signal EN1 is directly inputted to the transistor N1.

The resistive circuit 246 is coupled to the control terminal of the transistor N2 and ground, and receives the enable signal EN1. If the supply voltage VDD-2 is not powered, the resistive circuit 246 may pull down the level of the control terminal of the transistor N2 to ground, in order to ensure that the transistor N2 is turned off. For example, the resistive circuit 246 includes a resistor R7, in which a first terminal of the resistor R7 is coupled to the control terminal of the resistor R7, and a second terminal of the resistor R7 is coupled to ground.

The switching circuit 215 includes a transistor N3, a resistor R8, and a buffer circuit 217. A first terminal of transistor N3 is coupled to the pull-down resistor RD, a second terminal of the transistor N3 is coupled to ground, and a control terminal of the transistor N3 receives the enable signal EN2 via the buffer circuit 217. In some embodiments, the enable signal EN2 and the enable signal EN1 are logical complement. In some embodiments, the switching circuit 215 does not employ the buffer circuit 217. In other words, in these embodiments, the enable signal EN2 may be inputted to the transistor N3 directly. If the supply voltage VDD-2 is not powered, the resistor R8 may pull down the level of the control terminal of the transistor N3 to ground, in order to ensure that the transistor N3 is turned off.

Figure 3A:
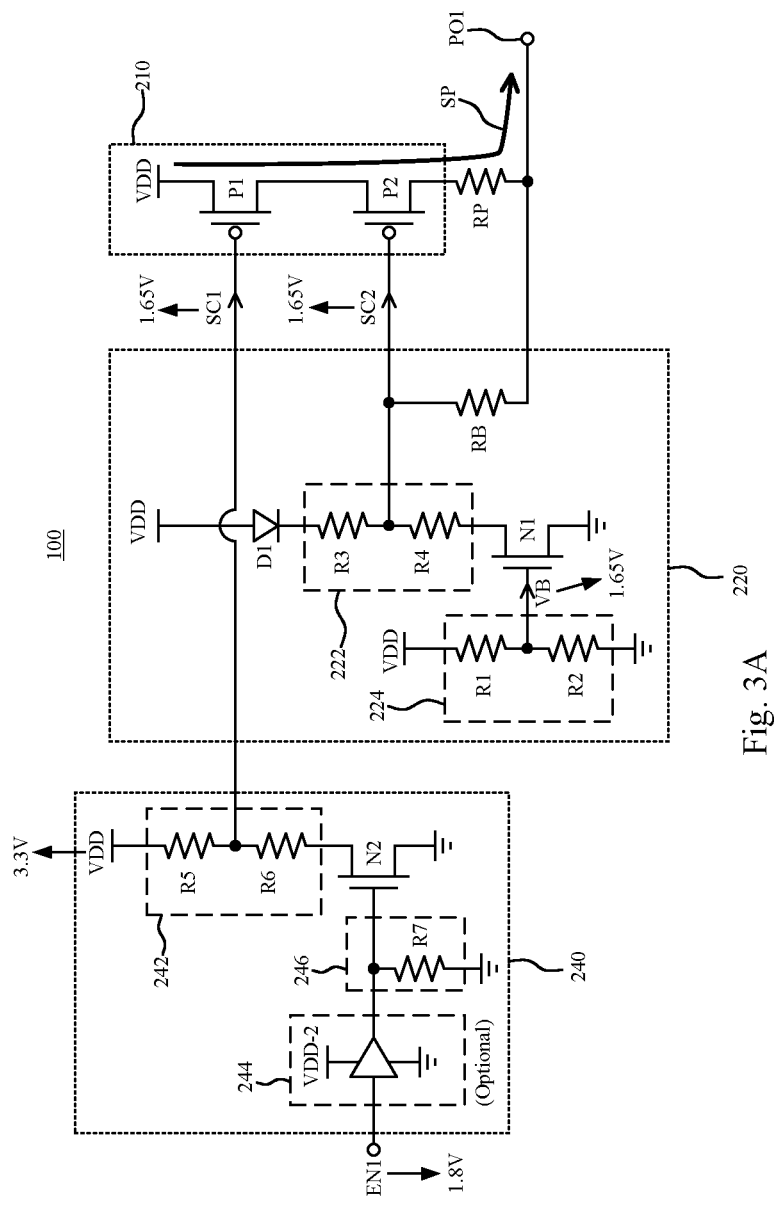
FIG. 3A is a schematic diagram of the port controller device in FIG. 2 that operates in a first mode according to some embodiments of the present disclosure.
Figure 3B:
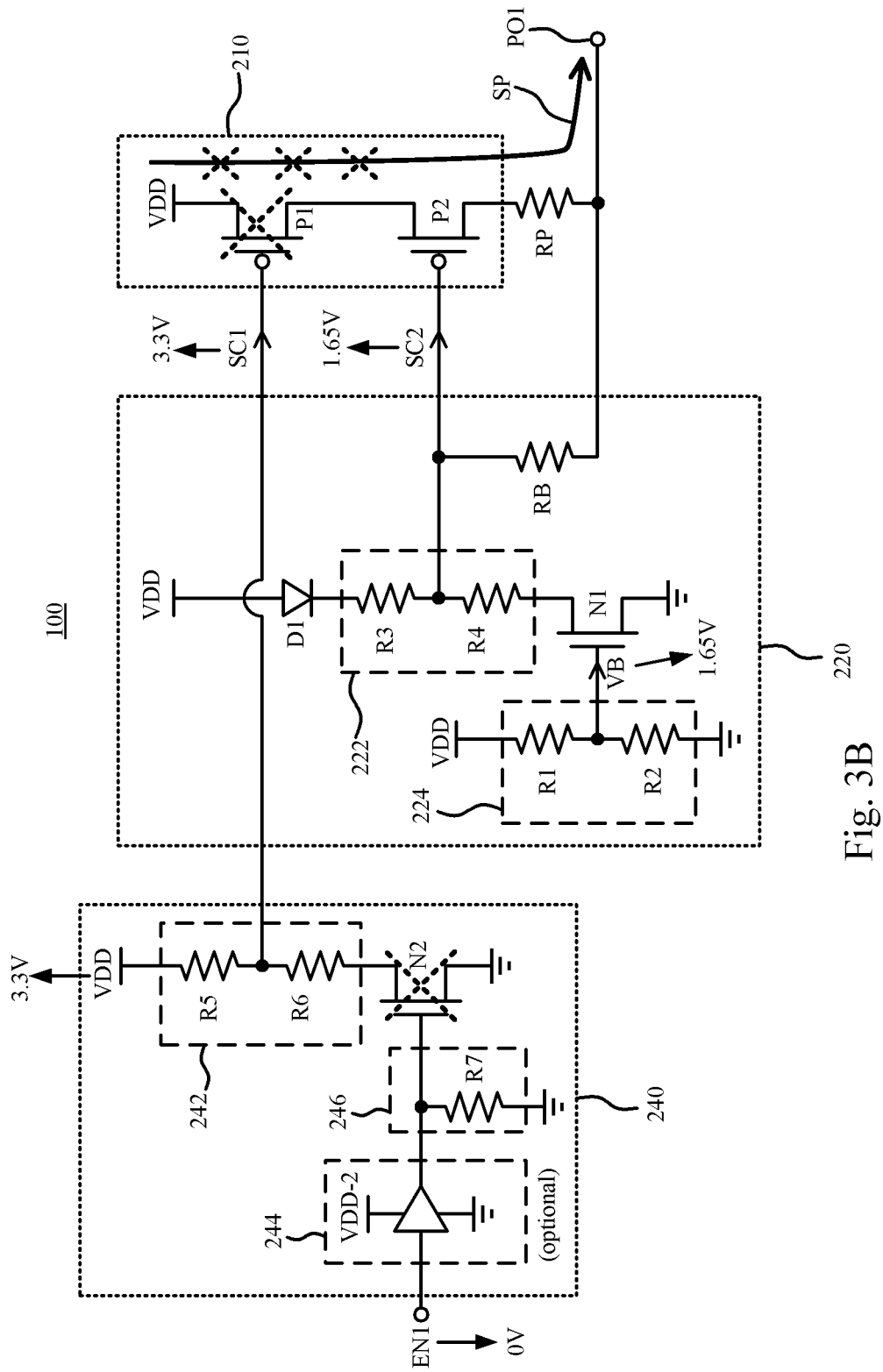
FIG. 3B is a schematic diagram of the port controller device in FIG. 2 that operates in a second mode according to some embodiments of the present disclosure.
Figure 3C:
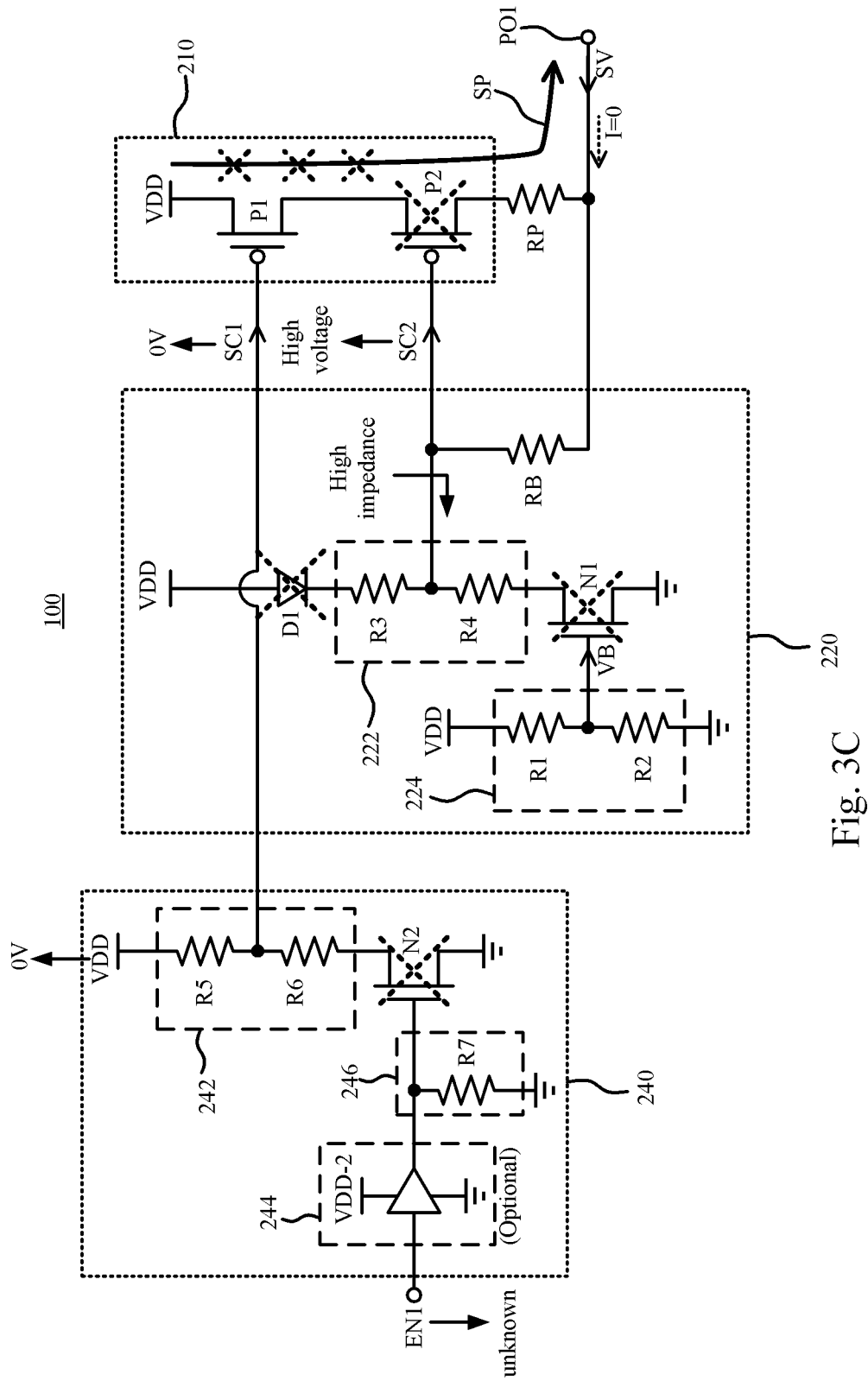
FIG. 3C is a schematic diagram illustrating operations of the port controller device in FIG. 2 when the system power source is not powered according to some embodiments of the present disclosure.

The following paragraphs will describe operations of the pull-up resistor RP with reference to FIG. 3A and FIG. 3B. For ease of understanding, the switching circuit 215 for controlling the pull-down resistor RD is not shown in FIG. 3A and FIG. 3B.

FIG. 3A is a schematic diagram of the port controller device 100 in FIG. 2 that operates in a first mode according to some embodiments of the present disclosure. In FIG. 2, each of the transistors P1-P2 and N1-N2 operates as a switch. In FIG. 3A, the system power source (i.e., the supply voltage VDD and the supply voltage VDD-2) are powered, the enable signal EN1 has a high level (e.g., 1.8V) corresponding to a logic value of 1. Under this condition, the port controller device 100 operates in a first mode, in order to transmit the supply voltage VDD the port PO1 via the pull-up resistor RP. In response to the enable signal EN1, the transistor N2 is turned on. As a result, the voltage generator circuit 242 divides the supply voltage VDD to generate the control signal SC1 having a level of about 1.65V.

Furthermore, the voltage generator circuit 224 divides the supply voltage VDD to generate the bias signal VB having the level of about 1.65V. In response to the bias signal VB, the transistor N1 is turned on. As a result, the diode D1 is turned on in response to the supply voltage VDD to transmit the supply voltage VDD to the voltage generator circuit 222. The voltage generator circuit 222 divides the supply voltage VDD to generate the control signal SC2 having the level of about of 1.65V. In response to the control signal SC1 and the control signal SC2, the transistor P1 and the transistor P2 are turned on. Under this condition, a signal path SP between the pull-up resistor RP and the port PO1 is turned on. As a result, the supply voltage VDD may be transmitted to the port PO1 via the pull-up resistor RP, in order to cooperate with the external electronic device 100-1 in FIG. 1 to perform the aforementioned voltage division.

FIG. 3B is a schematic diagram of the port controller device 100 in FIG. 2 that operates in a second mode according to some embodiments of the present disclosure. In FIG. 3B, the system power source is powered, and the enable signal EN1 has a low level (e.g., 0V) corresponding to a logic value of 0. Under this condition, the port controller device 100 operates in the second mode, in order not to transmit the supply voltage VDD to the port PO2 via the pull-up resistor RP. In some embodiments, when the port controller device 100 operates in the second mode, the port controller device 100 couples the port PO1 to ground via the pull-down resistor RD in response to the enable signal EN2. In response to the enable signal EN1, the transistor N2 is turned off. As a result, the supply voltage VDD is outputted to be the control signal SC1 via the resistor R5, in order to turn off the transistor P1. Under this condition, the signal path SP between the pull-up resistor RP and the port PO1 is not turned on, and thus the supply voltage VDD is not transmitted to the port PO1 via the pull-up resistor RP.

On the other hand, operations of the protection circuitry 220 in FIG. 3A and those in FIG. 3B are the same with each other, and thus the repetitious descriptions are not given. As described above, the resistance value of the resistor RB is much larger than that of the pull-up resistor RP, and the signal path SP is not turned on. As a result, impedance that is much larger than the pull-up resistor RP is formed on the port PO1. Under this condition, if the enable signal EN2 has the high level, the port PO1 is able to be coupled to ground via the pull-down resistor RD without being affected by the pull-up resistor RP.

FIG. 3C is a schematic diagram illustrating operations of the port controller device 100 in FIG. 2 when the system power source is not powered according to some embodiments of the present disclosure. In FIG. 3C, the system power source is not powered, and thus levels the supply voltage VDD, the supply voltage VDD-2, and the enable signal EN1 may be 0V or floating. Under this condition, the control terminal of the transistor N2 is pulled down to ground via the resistor R7, and the control terminal of the transistor N1 is pulled down to ground via the resistor R2. Accordingly, the transistor N2 is turned off by the resistor R7, and the transistor N1 is turned off by the resistor R2. As the supply voltage VDD is 0V, the diode D1 is not turned on. As the diode D1 and the transistor N1 are both not turned on, a high impedance is formed on the control terminal of the transistor P2. If a voltage SV exists on the port PO1, the first terminal of the resistor RB may generate a high voltage to be the control signal SC2 in response to the voltage SV. As a result, the transistor P2 is turned off according to the control signal SC2, in order to turn off the signal path SP. On the other hand, a current I from the port PO1 is limited by the resistor RB and the aforementioned high impedance to be close to (or equal to) 0. In other words, when the system power source is not powered, with operations of the protection circuitry 220, the signal path SP is turned off, and the current from the port PO1 is limited, in order to prevent from causing unnecessary power consumption.

As mentioned above, the aforementioned transistors may be implemented with transistors in an advanced process (e.g., a LDMOS in a technology of a fin field effect transistor (FinFET)), in which such transistors normally have a lower withstand voltage. In some other embodiments, the aforementioned transistors may be implemented with transistor having normal withstand voltage.

Figure 4:
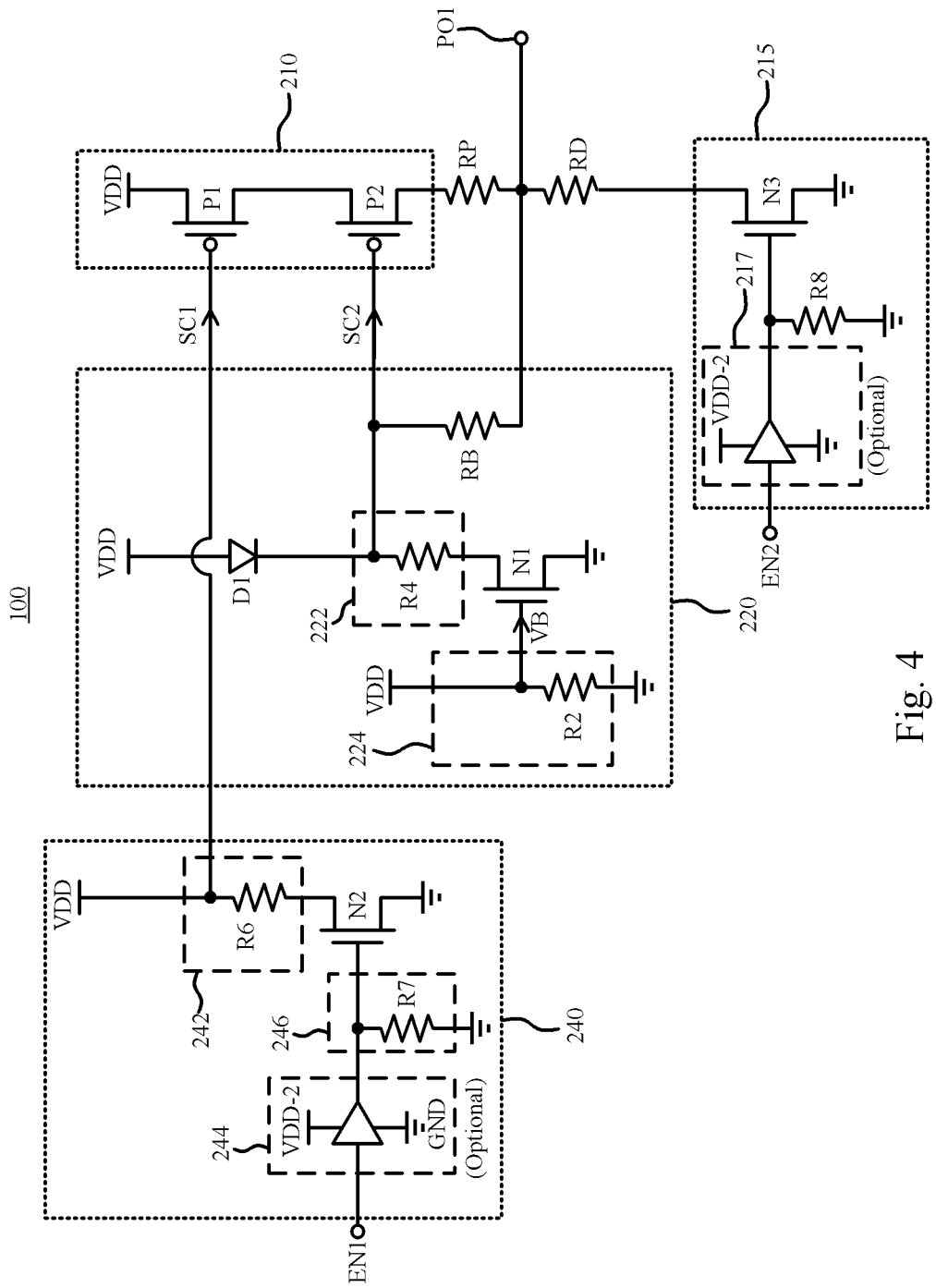
FIG. 4 is a circuit diagram of the port controller device in FIG. 1 according to some embodiments of the present disclosure.

FIG. 4 is a circuit diagram of the port controller device 100 in FIG. 1 according to some embodiments of the present disclosure. Compared with FIG. 2, in this example, each of the transistors P1-P2 and N1-N2 may be implemented with metal oxide semiconductor field effect transistors (MOSFETs) having a normal withstand voltage. In this example, the voltage generator circuit 222 excludes the resistor R3, the voltage generator circuit 224 excludes the resistor R1, and the voltage generator circuit 242 excludes the resistor R5. In other words, when the withstand voltage of each of the transistors P2, N1, and P1 is sufficient to withstand the supply voltage VDD, the voltage generator circuit 242 may generate the control signal SC2, the bias signal VB, and the control signal SC1 without dividing the supply voltage VDD.

The conductivity types (i.e., P-type or N-type) of the transistors and kinds (i.e., LDMOS or MOSFET) of the transistors are given for illustrative purposes, and the present disclosure is not limited thereto. Without departing the scope and operations of embodiments in the present disclosure, various circuit components and/or circuit architectures are within the contemplated scope of the present disclosure.

As described above, the port controller device in some embodiments of the present disclosure is able to be implemented with advanced transistors having lower withstand voltage, and is able to prevent the port from generating a leakage current or prevent from generating unnecessary power consumption when the system power source is not powered.

Various functional components or blocks have been described herein. As will be appreciated by persons skilled in the art, in some embodiments, the functional blocks will preferably be implemented through circuits (either dedicated circuits, or general purpose circuits, which operate under the control of one or more processors and coded instructions), which will typically comprise transistors or other circuit elements that are configured in such a way as to control the operation of the circuitry in accordance with the functions and operations described herein. As will be further appreciated, the specific structure or interconnections of the circuit elements will typically be determined by a compiler, such as a register transfer language (RTL) compiler. RTL compilers operate upon scripts that closely resemble assembly language code, to compile the script into a form that is used for the layout or fabrication of the ultimate circuitry. Indeed, RTL is well known for its role and use in the facilitation of the design process of electronic and digital systems.

The aforementioned descriptions represent merely some embodiments of the present disclosure, without any intention to limit the scope of the present disclosure thereto. Various equivalent changes, alterations, or modifications based on the claims of present disclosure are all consequently viewed as being embraced by the scope of the present disclosure.

What is claimed is:

1. A port controller device, comprising:
a pull-up resistor configured to be coupled to a port, wherein the port is configured to be coupled to a channel configuration pin of an electronic device, and the pull-up resistor is a resistor for detecting a cable orientation in a universal serial bus (USB) type-C interface;
a switching circuit configured to selectively transmit a supply voltage to the port via the pull-up resistor according to a first control signal, and turn off a signal path between the pull-up resistor and the port according to a second control signal;
an enabling circuitry configured to generate the first control signal according to an enable signal and the supply voltage; and
a protection circuitry configured to generate the second control signal in response to a voltage from the port when the supply voltage is not powered, in order to limit a current from the port.

2. The port controller device of claim 1, wherein the protection circuitry comprises:
a diode, wherein an anode of the diode is configured to receive the supply voltage;
a first voltage generator circuit coupled to a cathode of the diode, and configured to generate the second control signal according the supply voltage when the supply voltage is powered;
a resistor coupled between the first voltage generator circuit and the port, and configured to generate the second control signal in response to the voltage from the port when the supply voltage is not powered;
a first transistor coupled between the resistor and ground, and configured to be turned on according to a bias signal; and
a second voltage generator circuit configured to generate the bias signal according to the supply voltage.

3. The port controller device of claim 2, wherein a resistance value of the resistor is greater than a resistance value of the pull-up resistor.

4. The port controller device of claim 2, wherein if the supply voltage is not powered, the second voltage generator circuit outputs the bias signal to turn off the first transistor.

5. The port controller device of claim 2, wherein the switching circuit comprises a second transistor, the second transistor is turned on according to the second control signal, and if a withstand voltage of each of the first transistor and the second transistor is lower than the supply voltage, the first voltage generator circuit is configured to divide the supply voltage to generate the first control signal, and the second voltage generator circuit is configured to divide the supply voltage to generate the bias signal.

6. The port controller device of claim 5, wherein each of the first transistor and the second transistor is a laterally diffused metal oxide semiconductor.

7. The port controller device of claim 1, wherein the enabling circuitry comprises:
a voltage generator circuit configured to generate the first control signal according to the supply voltage;
a first transistor coupled between the voltage generator circuit and ground, and configured to be turned on according to the enable signal; and a resistive circuit coupled between a control terminal of the first transistor and ground, and configured to receive the enable signal.

8. The port controller device of claim 7, wherein the switching circuit comprises a second transistor, the second transistor is configured to be turned on according to the first control signal, and if a withstand voltage of the second transistor is lower than the supply voltage, the voltage generator circuit is configured to divide the supply voltage to generate the first control signal.

9. The port controller device of claim 8, wherein each of the first transistor and the second transistor is a laterally diffused metal oxide semiconductor.

10. The port controller device of claim 1, wherein the switching circuit comprises:
a first transistor configured to receive the supply voltage and to determine whether to transmit the supply voltage to the port via the pull-up resistor according to the first control signal; and
a second transistor coupled between the first transistor and the pull-up resistor, and configured to turn off the signal path according to the second control signal.

11. The port controller device of claim 10, wherein if a withstand voltage of each of the first transistor and the second transistor is lower than the supply voltage, the enable circuitry is further configured to divide the supply voltage to generate the second control signal when the supply voltage is powered.

12. A port controller device, comprising:
a first switch configured to receive a supply voltage and configured to be turned on according to a first control signal;
a second switch coupled between a pull-up resistor and the first switch, wherein the pull-up resistor is configured to be coupled to a port;
a diode, wherein an anode of the diode is configured to receive the supply voltage;
a first voltage generator circuit configured to receive the supply voltage from a cathode of the diode, and to divide the supply voltage to generate a second control signal to a control terminal of the second switch;
a resistor coupled between the control terminal of the second switch and the port;
a third switch coupled between the first voltage generator circuit and ground; and
a second voltage generator circuit configured to divide the supply voltage to generate a bias signal to a control terminal of the third switch, wherein a withstand voltage of each of the second switch and the third switch is lower than the supply voltage.

13. The port controller device of claim 12, further comprising:
a third voltage generator circuit configured to divide the supply voltage to generate the first control signal, wherein a withstand voltage of the first switch is lower than the supply voltage;
a fourth switch coupled between the third voltage generator and ground; and
a resistor coupled between a control terminal of the fourth switch and ground, and configured to receive an enable signal.

14. The port controller device of claim 13, wherein if the supply voltage is not powered, the fourth switch is turned off by the resistor.

15. The port controller device of claim 12, wherein each of the first switch, the second switch, and the third switch a laterally diffused metal oxide semiconductor.

16. The port controller device of claim 12, wherein the pull-up resistor is a resistor for detecting a cable orientation in a universal serial bus (USB) type-C interface.

17. A port controller device, comprising:
a pull-up resistor configured to be coupled to a port, wherein the port is configured to be coupled to a channel configuration pin of an electronic device;
a switching circuit configured to selectively transmit a supply voltage to the port via the pull-up resistor according to a first control signal, and turn off a signal path between the pull-up resistor and the port according to a second control signal;
a voltage generator circuit configured to generate the first control signal according to the supply voltage;
a first transistor coupled between the voltage generator circuit and ground, and configured to be turned on according to an enable signal;
a resistive circuit coupled between a control terminal of the first transistor and ground, and configured to receive the enable signal; and
a protection circuitry configured to generate the second control signal in response to a voltage from the port when the supply voltage is not powered, in order to limit a current from the port.

18. The port controller device of claim 17, wherein the switching circuit comprises a second transistor, the second transistor is configured to be turned on according to the first control signal, and if a withstand voltage of the second transistor is lower than the supply voltage, the voltage generator circuit is configured to divide the supply voltage to generate the first control signal.

19. The port controller device of claim 18, wherein each of the first transistor and the second transistor is a laterally diffused metal oxide semiconductor.

20. The port controller device of claim 17, wherein the switching circuit comprises:
a first transistor configured to receive the supply voltage and to determine whether to transmit the supply voltage to the port via the pull-up resistor according to the first control signal; and
a second transistor coupled between the first transistor and the pull-up resistor, and configured to turn off the signal path according to the second control signal.

* * * * *